(12) United States Patent
Sundaresh et al.

(10) Patent No.: US 10,825,263 B2
(45) Date of Patent: Nov. 3, 2020

(54) ADVANCED DISCRETE CONTROL DEVICE DIAGNOSTIC ON DIGITAL OUTPUT MODULES

(71) Applicant: Honeywell International Inc., Morris Plains, NJ (US)

(72) Inventors: Nagaraja Sundaresh, Hyderabad (IN); Shankar Rao Pendyala, Hyderabad (IN); Michael D. Carney, Havertown, PA (US); Shripad K. Pande, Hyderabad (IN)

(73) Assignee: Honeywell International Inc., Morris Plains, NJ (US)

( * ) Notice: Subject to any disclaimer, the term of this patent is extended or adjusted under 35 U.S.C. 154(b) by 245 days.

(21) Appl. No.: 15/615,562

(22) Filed: Jun. 6, 2017

(65) Prior Publication Data

US 2017/0365153 A1    Dec. 21, 2017

Related U.S. Application Data

(60) Provisional application No. 62/350,795, filed on Jun. 16, 2016.

(51) Int. Cl.
*G08B 21/18* (2006.01)
*G06F 11/07* (2006.01)
(Continued)

(52) U.S. Cl.
CPC .......... *G07C 3/005* (2013.01); *G01R 31/282* (2013.01); *G01R 31/3167* (2013.01);
(Continued)

(58) Field of Classification Search
CPC .... G08B 21/18; G08B 21/182; G08B 21/187; G01R 31/02; G07C 3/14
See application file for complete search history.

(56) References Cited

U.S. PATENT DOCUMENTS

| 4,852,080 A | 7/1989 | Ohtake et al. |
| 5,095,417 A | 3/1992 | Hagiwara et al. |
(Continued)

FOREIGN PATENT DOCUMENTS

| JP | 2007527073 A | 9/2007 |
| JP | 4990755 B2 | 8/2012 |
(Continued)

OTHER PUBLICATIONS

International Search Report dated Oct. 10, 2014, in connection with International Application No. PCT/US2014/038208; 3 pages.
(Continued)

*Primary Examiner* — Matthew Luu
*Assistant Examiner* — Kendrick X Liu

(57) ABSTRACT

An apparatus performs methods for device diagnostics based on signals from digital outputs. The apparatus includes an input/output module with a digital output module to be coupled to a device. The input/output module measures one or more characteristics of a digital signal provided by the digital output module, where at least one of the one or more characteristics of the digital signal is associated with an output current of the digital output module. The input/output module also performs one or more diagnostics using the one or more measured characteristics of the digital signal.

20 Claims, 7 Drawing Sheets

(51) Int. Cl.

| | | |
|---|---|---|
| *G01R 31/56* | (2020.01) | |
| *G01R 31/28* | (2006.01) | |
| *G01R 31/3167* | (2006.01) | |
| *G07C 3/00* | (2006.01) | |
| *G06F 11/00* | (2006.01) | |
| *G01R 31/50* | (2020.01) | |
| *G07C 3/14* | (2006.01) | |

(52) U.S. Cl.
CPC ............. *G01R 31/56* (2020.01); *G06F 11/00* (2013.01); *G06F 11/07* (2013.01); *G08B 21/18* (2013.01); *G08B 21/182* (2013.01); *G01R 31/2812* (2013.01); *G01R 31/50* (2020.01); *G07C 3/14* (2013.01); *G08B 21/187* (2013.01)

(56) References Cited

U.S. PATENT DOCUMENTS

| | | | |
|---|---|---|---|
| 5,179,353 | A | 1/1993 | Miyake |
| 5,278,508 | A * | 1/1994 | Bowman ............ G01R 31/2832 |
| | | | 324/103 R |
| 5,293,122 | A | 3/1994 | Cake et al. |
| 5,341,431 | A | 8/1994 | Griessman et al. |
| 5,357,517 | A | 10/1994 | Takebe |
| 5,958,030 | A | 9/1999 | Kwa |
| 6,061,809 | A | 5/2000 | Glaser et al. |
| 6,170,439 | B1 | 1/2001 | Duncan et al. |
| 6,426,856 | B1 * | 7/2002 | Schneerson ............ H02H 3/05 |
| | | | 361/65 |
| 6,567,653 | B1 | 5/2003 | Sanders |
| 6,639,806 | B1 | 10/2003 | Chuang et al. |
| 6,654,351 | B1 | 11/2003 | Casey |
| 6,862,636 | B2 | 3/2005 | Young |
| 6,981,090 | B1 | 12/2005 | Kutz et al. |
| 7,165,139 | B2 | 1/2007 | Bruner et al. |
| 7,227,349 | B2 | 6/2007 | Kirkpatrick |
| 7,480,126 | B2 | 1/2009 | Cetrulo et al. |
| 7,555,004 | B2 | 6/2009 | Orlik et al. |
| 7,969,300 | B2 | 6/2011 | Coronel et al. |
| 8,072,098 | B2 * | 12/2011 | Elias ................ G01D 21/00 |
| | | | 307/140 |
| 8,135,884 | B1 | 3/2012 | Sullam et al. |
| 8,239,046 | B2 | 8/2012 | Koehler et al. |
| 8,315,263 | B2 | 11/2012 | Enns et al. |
| 8,352,049 | B2 | 1/2013 | Hsiung et al. |
| 8,392,626 | B2 | 3/2013 | Wormmeester et al. |
| 8,583,067 | B2 | 11/2013 | Budampatl et al. |
| 8,656,065 | B1 | 2/2014 | Gerhart et al. |
| 8,667,091 | B2 | 3/2014 | Almadi et al. |
| 8,868,907 | B2 | 10/2014 | Graham et al. |
| 9,021,255 | B1 | 4/2015 | Aharoni et al. |
| 9,379,972 | B2 | 6/2016 | Enns et al. |
| 9,908,418 | B2 * | 3/2018 | Lopez De Arroyabe ................. |
| | | | H02H 3/087 |
| 2001/0015924 | A1 | 8/2001 | Arimoto et al. |
| 2002/0126408 | A1 | 9/2002 | Okuyama et al. |
| 2002/0147503 | A1 | 10/2002 | Osburn, III |
| 2003/0001618 | A1 | 1/2003 | Haycock et al. |
| 2003/0151513 | A1 | 8/2003 | Herrmann et al. |
| 2004/0199674 | A1 | 10/2004 | Brinkhus |
| 2004/0259533 | A1 | 12/2004 | Nixon et al. |
| 2005/0058453 | A1 | 3/2005 | Mostert et al. |
| 2005/0070177 | A1 | 3/2005 | Stoll |
| 2005/0174964 | A1 | 8/2005 | Orlik et al. |
| 2005/0216107 | A1 | 9/2005 | O'Donnell et al. |
| 2005/0243867 | A1 | 11/2005 | Petite |
| 2005/0273205 | A1 | 12/2005 | Nickerson et al. |
| 2006/0087402 | A1 | 4/2006 | Manning et al. |
| 2006/0170403 | A1 | 8/2006 | Im |
| 2006/0202728 | A1 | 9/2006 | Wich |
| 2006/0240818 | A1 | 10/2006 | McCoy et al. |
| 2007/0213652 | A1 | 9/2007 | Carter |
| 2007/0223382 | A1 | 9/2007 | Crabtree et al. |
| 2007/0280144 | A1 | 12/2007 | Hodson et al. |
| 2008/0077336 | A1 | 3/2008 | Fernandes |
| 2008/0080395 | A1 | 4/2008 | Law et al. |
| 2009/0201150 | A1 | 8/2009 | Becker |
| 2009/0224906 | A1 | 9/2009 | Balgard et al. |
| 2009/0271558 | A1 | 10/2009 | Wormmeester et al. |
| 2009/0316628 | A1 | 12/2009 | Enns et al. |
| 2010/0079007 | A1 | 4/2010 | Elias et al. |
| 2010/0123483 | A1 | 5/2010 | Chung et al. |
| 2010/0176933 | A1 | 7/2010 | Barragan Trevino et al. |
| 2010/0264946 | A1 * | 10/2010 | Hagen ................ G01R 31/2834 |
| | | | 324/756.06 |
| 2011/0110291 | A1 | 5/2011 | Ishii |
| 2011/0246791 | A1 | 10/2011 | Kambayashi et al. |
| 2011/0276607 | A1 | 11/2011 | Surna et al. |
| 2012/0041574 | A1 | 2/2012 | Hsiung et al. |
| 2012/0063330 | A1 | 3/2012 | Mori et al. |
| 2012/0078869 | A1 | 3/2012 | Bellville et al. |
| 2012/0084400 | A1 | 4/2012 | Almadi et al. |
| 2012/0151588 | A1 | 6/2012 | Wang et al. |
| 2012/0230446 | A1 | 9/2012 | Feng |
| 2012/0236768 | A1 | 9/2012 | Kolavennu et al. |
| 2012/0290735 | A1 | 11/2012 | Johnson et al. |
| 2012/0293017 | A1 * | 11/2012 | Lidsky ................ H02H 3/087 |
| | | | 307/126 |
| 2013/0110998 | A1 | 5/2013 | Zrelli et al. |
| 2013/0151849 | A1 | 6/2013 | Graham et al. |
| 2013/0173840 | A1 | 7/2013 | Calvin et al. |
| 2013/0246801 | A1 | 9/2013 | Takahashi et al. |
| 2013/0262064 | A1 | 10/2013 | Mazzaro et al. |
| 2013/0307699 | A1 | 11/2013 | Brekke et al. |
| 2013/0344839 | A1 | 12/2013 | Roach |
| 2014/0092503 | A1 | 4/2014 | Ostrovsky |
| 2014/0119290 | A1 | 5/2014 | Grewal et al. |
| 2014/0232555 | A1 | 8/2014 | Aakvaag et al. |
| 2014/0321443 | A1 | 10/2014 | Samudrala et al. |
| 2015/0058480 | A1 | 2/2015 | Aligaier et al. |
| 2015/0270014 | A1 | 9/2015 | Ellis |
| 2015/0278144 | A1 | 10/2015 | McLaughlin et al. |
| 2015/0304193 | A1 | 10/2015 | Ishii et al. |
| 2015/0355242 | A1 | 12/2015 | Ozawa |
| 2016/0048474 | A1 | 2/2016 | Lv et al. |

FOREIGN PATENT DOCUMENTS

| | | |
|---|---|---|
| JP | 2013535730 A | 9/2013 |
| KR | 20100066815 A1 | 6/2010 |
| KR | 20120135142 A | 12/2012 |
| WO | 2005086110 A2 | 9/2005 |
| WO | 2014197182 A1 | 12/2014 |
| WO | 2015047744 A1 | 4/2015 |

OTHER PUBLICATIONS

Written Opinion of the International Searching Authority dated Oct. 10, 2014, in connection with International Application No. PCT/US2014/038208; 5 pages.
International Search Report dated Dec. 11, 2014, in connection with International Application No. PCT/US2014/055307; 4 pages.
Written Opinion of the International Searching Authority dated Dec. 11, 2014, in connection with International Application No. PCT/US2014/055307; 7 pages.
European Search Report dated Sep. 22, 2014, in connection with European Patent Application No. 14164273.6; 3 pages.
David D. Brandt, "Solving the Issue of Interoperability among Devices and Systems", May 19, 2008, p. 1-21, XP055091082.
Supplementary European Search Report dated Apr. 28, 2017, in connection with European Patent Application No. EP 14 84 8127; 9 pages.
International Search Report and Written Opinion dated Oct. 27, 2015, in connection with PCT/US2015/043607; 12 pages.
"25A Right Angle Signal/Power Combo", SAMTEC Power Strip 25, 2008, 1 page.
"FCN-RTU Low Power Autonomous Controller Hardware", STARDOM FCN-RTU, Yokogawa Electric Corporation, Dec. 2008, 13 pages.

(56) References Cited

OTHER PUBLICATIONS

"ControlWave Micro Process Automation Controller", Instruction Manual, Emerson Process Management, Jun. 2013, 170 pages.
U.S. Patent Application "Remote Terminal Unit (RTU) With Wireless Diversity and Related Method" U.S. Appl. No. 14/035,557, filed Sep. 24, 2013. 33 pages.
Notification of Transmittal of the International Search Report and the Written Opinion of the International Searching Authority, or the Declaration dated Jun. 10, 2015, in connection with International Patent Application No. PCT/US2015/019671; 12 pages.
Siemens; "New SM322-813H01 Digital Output Module with Diagnostics"; Industry Online Support; Siemens AG; https://support.industry.siemens.com/cs/document/17968869/new-sm322-8bh01-digital-output-module-with-diagnostics?dti=0&lc=en-CN; 2 pages.
Siemens; "SIMATIC—ET 200M Signal Modules for Process Automation—Configuration Manual—Oct. 2014 Edition"; ASE00085262-04; 74 pages.
Rockwell Automation; "FLEX I/O Digital input and Output Modules w/Diagnostics—Installation Instructions"; Allen-Bradley; Publication 1794-IN096C-EN-P; Aug. 2015; 22 pages.
International Search Report and Written Opinion of the International Searching Authority for International Application No. PCT/US2017/036960 dated Sep. 21, 2017, 10 pages.

\* cited by examiner

ADVANCED DISCRETE CONTROL DEVICE DIAGNOSTIC ON DIGITAL OUTPUT MODULES

CROSS-REFERENCE TO RELATED APPLICATION AND PRIORITY CLAIM

This application claims priority under 35 U.S.C. § 119(e) to U.S. Provisional Patent Application No. 62/350,795 filed on Jun. 16, 2016. This provisional patent application is hereby incorporated by reference in its entirety into this disclosure.

TECHNICAL FIELD

This disclosure relates generally to diagnostics for devices in industrial process control and automation systems or other systems. More specifically, this disclosure relates to device diagnostics based on signals from digital outputs.

BACKGROUND

Industrial process control and automation systems are often used to automate and operate large and complex industrial processes. These types of systems routinely include sensors, actuators, and other field devices that can measure, adjust, or otherwise monitor or interact with one or more industrial processes. Diagnostic information related to field devices can be very useful in an industrial control and automation environment or other environment, such as to detect abnormal or faulty operation of field devices. Some field devices support the use of one or more digital outputs, each of which can provide a digital output signal. Conventionally, digital outputs come with only basic diagnostic capabilities, such as the ability to detect open-circuit and short-circuit conditions.

SUMMARY

This disclosure provides device diagnostics based on signals from digital outputs.

In a first embodiment, a method is provided. The method includes measuring one or more characteristics of a digital signal provided by a digital output module, the digital output module coupled to a device, at least one of the one or more characteristics of the digital signal associated with an output current of the digital output module. The method further includes performing one or more diagnostics using the one or more measured characteristics of the digital signal.

In a second embodiment, an apparatus is provided. The apparatus includes an input/output module with a digital output module configured to be coupled to a device. The input/output module is configured to measure one or more characteristics of a digital signal provided by the digital output module, where at least one of the one or more characteristics of the digital signal is associated with an output current of the digital output module. The input/output module is also configured to perform one or more diagnostics using the one or more measured characteristics of the digital signal.

In a third embodiment, a non-transitory machine-readable medium is provided. The non-transitory machine-readable medium is encoded with executable instructions that, when executed, cause one or more processors to measure one or more characteristics of a digital signal provided by the digital output module, wherein at least one of the one or more characteristics of the digital signal associated with an output current of the digital output module and perform one or more diagnostics using the one or more measured characteristics of the digital signal.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 10, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

As described above, conventional digital outputs are often provided with only basic diagnostic capabilities, such as the ability to detect open-circuit and short-circuit conditions. This disclosure describes more advanced diagnostics for output to devices such as solenoids, actuators, and relays that can be provided using digital outputs. For example, this disclosure can make use of the capabilities of a universal input/output (UIO) module or other reconfigurable input/output module to provide advanced diagnostics by measuring and characterizing digital output currents.

Figure 1:
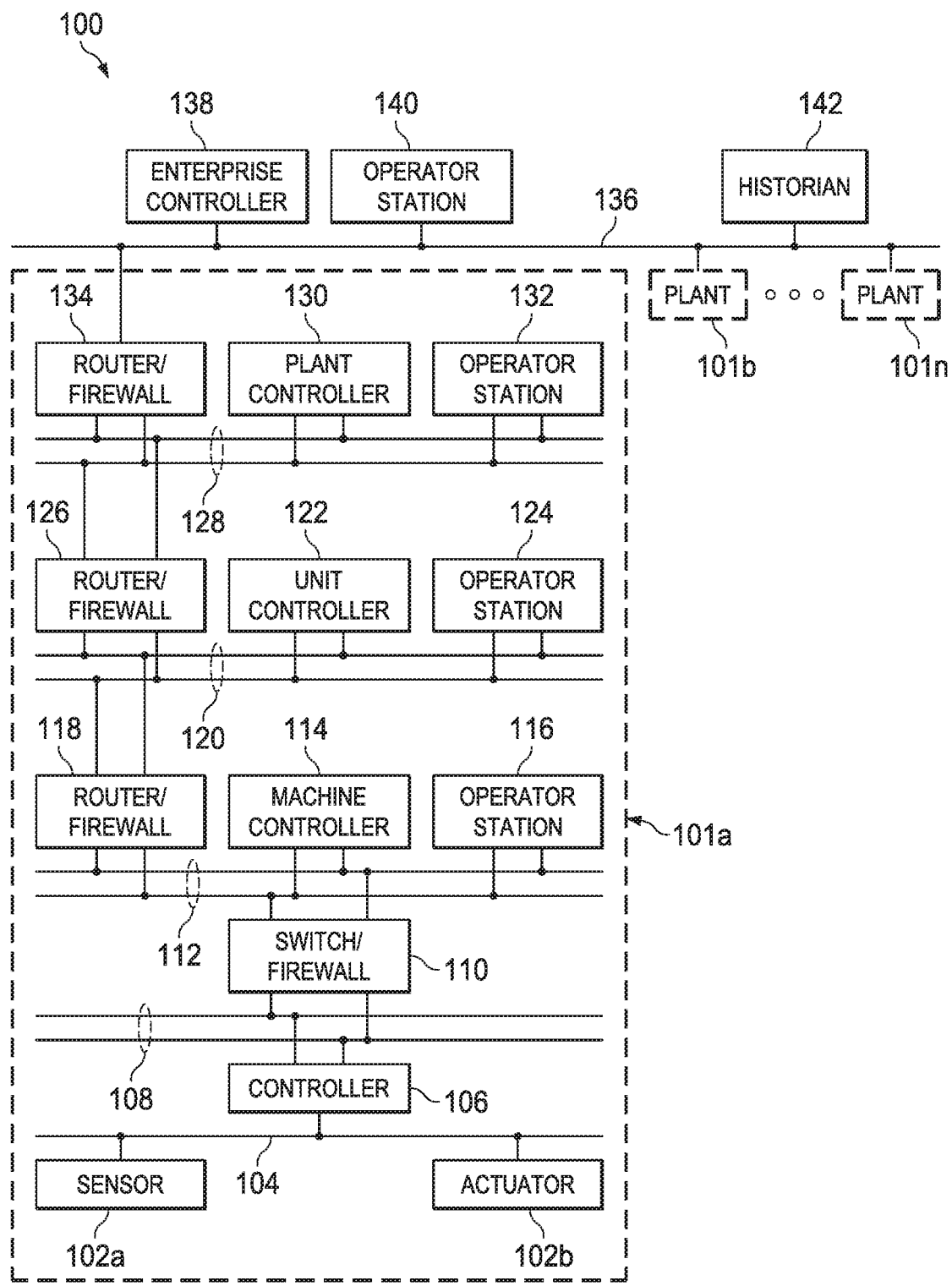
FIG. 1 illustrates an example industrial process control and automation system according to this disclosure.

FIG. 1 illustrates an example industrial process control and automation system 100 according to this disclosure. As shown in FIG. 1, the system 100 includes various components that facilitate production or processing of at least one product or other material. For instance, the system 100 is used here to facilitate control over components in one or multiple plants 101*a*-101*n*. Each plant 101*a*-101*n* represents one or more processing facilities (or one or more portions thereof), such as one or more manufacturing facilities for producing at least one product or other material. In general, each plant 101*a*-101*n* may implement one or more processes and can individually or collectively be referred to as a process system. A process system generally represents any system or portion thereof configured to process one or more products or other materials in some manner.

In FIG. 1, the system 100 is implemented using the Purdue model of process control. In the Purdue model, "Level 0" may include one or more sensors 102a and one or more actuators 102b. The sensors 102a and actuators 102b represent components in a process system that may perform any of a wide variety of functions. For example, the sensors 102a could measure a wide variety of characteristics in the process system, such as temperature, pressure, or flow rate. Also, the actuators 102b could alter a wide variety of characteristics in the process system. The sensors 102a and actuators 102b could represent any other or additional components in any suitable process system. Each of the sensors 102a includes any suitable structure for measuring one or more characteristics in a process system. Each of the actuators 102b includes any suitable structure for operating on or affecting one or more conditions in a process system.

One or more networks 104 are coupled to the sensors 102a and actuators 102b. The network 104 facilitates interaction with the sensors 102a and actuators 102b. For example, the network 104 could transport measurement data from the sensors 102a and provide control signals to the actuators 102b. The network 104 could represent any suitable network or combination of networks. As particular examples, the network 104 could represent an Ethernet network, an electrical signal network (such as a HART or FOUNDATION FIELDBUS network), a pneumatic control signal network, or any other or additional type(s) of network(s).

In the Purdue model, "Level 1" includes one or more controllers 106, which are coupled to the network 104. Among other things, each controller 106 may use the measurements from one or more sensors 102a to control the operation of one or more actuators 102b. Each controller 106 includes any suitable structure for controlling one or more aspects of a process system. As a particular example, each controller 106 could represent a computing device running a real-time operating system.

Redundant networks 108 are coupled to the controllers 106. The networks 108 facilitate interaction with the controllers 106, such as by transporting data to and from the controllers 106. The networks 108 could represent any suitable redundant networks. As particular examples, the networks 108 could represent a pair of Ethernet networks or a redundant pair of Ethernet networks, such as a FAULT TOLERANT ETHERNET (FTE) network from HONEYWELL INTERNATIONAL INC.

At least one switch/firewall 110 couples the networks 108 to two networks 112. The switch/firewall 110 may transport traffic from one network to another. The switch/firewall 110 may also block traffic on one network from reaching another network. The switch/firewall 110 includes any suitable structure for providing communication between networks, such as a HONEYWELL CONTROL FIREWALL (CF9) device. The networks 112 could represent any suitable networks, such as a pair of Ethernet networks or an FTE network.

In the Purdue model, "Level 2" may include one or more machine-level controllers 114 coupled to the networks 112. The machine-level controllers 114 perform various functions to support the operation and control of the controllers 106, sensors 102a, and actuators 102b, which could be associated with a particular piece of industrial equipment (such as a boiler or other machine). For example, the machine-level controllers 114 could log information collected or generated by the controllers 106, such as measurement data from the sensors 102a or control signals for the actuators 102b. The machine-level controllers 114 could also execute applications that control the operation of the controllers 106, thereby controlling the operation of the actuators 102b. In addition, the machine-level controllers 114 could provide secure access to the controllers 106. Each of the machine-level controllers 114 includes any suitable structure for providing access to, control of, or operations related to a machine or other individual piece of equipment. Each of the machine-level controllers 114 could, for example, represent a server computing device running a MICROSOFT WINDOWS operating system. Although not shown, different machine-level controllers 114 could be used to control different pieces of equipment in a process system (where each piece of equipment is associated with one or more controllers 106, sensors 102a, and actuators 102b).

One or more operator stations 116 are coupled to the networks 112. The operator stations 116 represent computing or communication devices providing user access to the machine-level controllers 114, which could then provide user access to the controllers 106 (and possibly the sensors 102a and actuators 102b). As particular examples, the operator stations 116 could allow users to review the operational history of the sensors 102a and actuators 102b using information collected by the controllers 106 and/or the machine-level controllers 114. The operator stations 116 could also allow the users to adjust the operation of the sensors 102a, actuators 102b, controllers 106, or machine-level controllers 114. In addition, the operator stations 116 could receive and display warnings, alerts, or other messages or displays generated by the controllers 106 or the machine-level controllers 114. Each of the operator stations 116 includes any suitable structure for supporting user access and control of one or more components in the system 100. Each of the operator stations 116 could, for example, represent a computing device running a MICROSOFT WINDOWS operating system.

At least one router/firewall 118 couples the networks 112 to two networks 120. The router/firewall 118 includes any suitable structure for providing communication between networks, such as a secure router or combination router/firewall. The networks 120 could represent any suitable networks, such as a pair of Ethernet networks or an FTE network.

In the Purdue model, "Level 3" may include one or more unit-level controllers 122 coupled to the networks 120. Each unit-level controller 122 is typically associated with a unit in a process system, which represents a collection of different machines operating together to implement at least part of a process. The unit-level controllers 122 perform various functions to support the operation and control of components in the lower levels. For example, the unit-level controllers 122 could log information collected or generated by the components in the lower levels, execute applications that control the components in the lower levels, and provide secure access to the components in the lower levels. Each of the unit-level controllers 122 includes any suitable structure for providing access to, control of, or operations related to one or more machines or other pieces of equipment in a process unit. Each of the unit-level controllers 122 could, for example, represent a server computing device running a MICROSOFT WINDOWS operating system. Although not shown, different unit-level controllers 122 could be used to control different units in a process system (where each unit is associated with one or more machine-level controllers 114, controllers 106, sensors 102a, and actuators 102b).

Access to the unit-level controllers 122 may be provided by one or more operator stations 124. Each of the operator stations 124 includes any suitable structure for supporting user access and control of one or more components in the system 100. Each of the operator stations 124 could, for example, represent a computing device running a MICROSOFT WINDOWS operating system.

At least one router/firewall 126 couples the networks 120 to two networks 128. The router/firewall 126 includes any suitable structure for providing communication between networks, such as a secure router or combination router/firewall. The networks 128 could represent any suitable networks, such as a pair of Ethernet networks or an FTE network.

In the Purdue model, "Level 4" may include one or more plant-level controllers 130 coupled to the networks 128. Each plant-level controller 130 is typically associated with one of the plants 101a-101n, which may include one or more process units that implement the same, similar, or different processes. The plant-level controllers 130 perform various functions to support the operation and control of components in the lower levels. As particular examples, the plant-level controller 130 could execute one or more manufacturing execution system (MES) applications, scheduling applications, or other or additional plant or process control applications. Each of the plant-level controllers 130 includes any suitable structure for providing access to, control of, or operations related to one or more process units in a process plant. Each of the plant-level controllers 130 could, for example, represent a server computing device running a MICROSOFT WINDOWS operating system.

Access to the plant-level controllers 130 may be provided by one or more operator stations 132. Each of the operator stations 132 includes any suitable structure for supporting user access and control of one or more components in the system 100. Each of the operator stations 132 could, for example, represent a computing device running a MICROSOFT WINDOWS operating system.

At least one router/firewall 134 couples the networks 128 to one or more networks 136. The router/firewall 134 includes any suitable structure for providing communication between networks, such as a secure router or combination router/firewall. The network 136 could represent any suitable network, such as an enterprise-wide Ethernet or other network or all or a portion of a larger network (such as the Internet).

In the Purdue model, "Level 5" may include one or more enterprise-level controllers 138 coupled to the network 136. Each enterprise-level controller 138 is typically able to perform planning operations for multiple plants 101a-101n and to control various aspects of the plants 101a-101n. The enterprise-level controllers 138 can also perform various functions to support the operation and control of components in the plants 101a-101n. As particular examples, the enterprise-level controller 138 could execute one or more order processing applications, enterprise resource planning (ERP) applications, advanced planning and scheduling (APS) applications, or any other or additional enterprise control applications. Each of the enterprise-level controllers 138 includes any suitable structure for providing access to, control of, or operations related to the control of one or more plants. Each of the enterprise-level controllers 138 could, for example, represent a server computing device running a MICROSOFT WINDOWS operating system. In this document, the term "enterprise" refers to an organization having one or more plants or other processing facilities to be managed. Note that if a single plant 101a is to be managed, the functionality of the enterprise-level controller 138 could be incorporated into the plant-level controller 130.

Access to the enterprise-level controllers 138 may be provided by one or more operator stations 140. Each of the operator stations 140 includes any suitable structure for supporting user access and control of one or more components in the system 100. Each of the operator stations 140 could, for example, represent a computing device running a MICROSOFT WINDOWS operating system.

A historian 142 is also coupled to the network 136 in this example. The historian 142 could represent a component that stores various information about the system 100. The historian 142 could, for example, store information used during production scheduling and optimization. The historian 142 represents any suitable structure for storing and facilitating retrieval of information. Although shown as a single centralized component coupled to the network 136, the historian 142 could be located elsewhere in the system 100, or multiple historians could be distributed in different locations in the system 100.

One or more devices shown in FIG. 1 could support the use of one or more digital output modules. A digital output module denotes a structure configured to provide a digital output signal. For example, one or more actuators 102b or other field devices could include digital output modules that are used to output digital signals. As described below, the output signals from digital output modules can be used to provide more advanced diagnostics for field devices. In particular embodiments, the one or more digital output modules that support more advanced diagnostics are incorporated into one or more UIO modules. UIO modules allow one or more input/output (I/O) modules to be selectively configured and reconfigured, such as by allowing each I/O module to be configured as an analog input, an analog output, a digital input, or a digital output (among other options). This type of functionality provides various benefits, such as the ability to support late I/O binding and to reduce or eliminate the need for marshalling. The ability to provide advanced device diagnostics for I/O modules configured as digital outputs provides an additional benefit.

The ability to provide more advanced device diagnostics can be useful in various ways. For example, more advanced device diagnostics could be used to provide early or earlier warnings of potential field device failures. This may allow maintenance to occur sooner, potentially before a field device failure actually occurs. This can result in improved maintenance and reduced down-time of an industrial process or other system, with associated monetary savings.

Although FIG. 1 illustrates one example of an industrial process control and automation system 100, various changes may be made to FIG. 1. For example, industrial control and automation systems come in a wide variety of configurations. The system 100 shown in FIG. 1 is meant to illustrate one example operational environment in which device diagnostics based on signals from digital outputs may be needed or desired. However, FIG. 1 does not limit this disclosure to any particular configuration or operational environment. In general, the approaches for providing device diagnostics based on signals from digital outputs can be used in any suitable system, and that system need not relate to industrial process control or automation.

Figure 2:
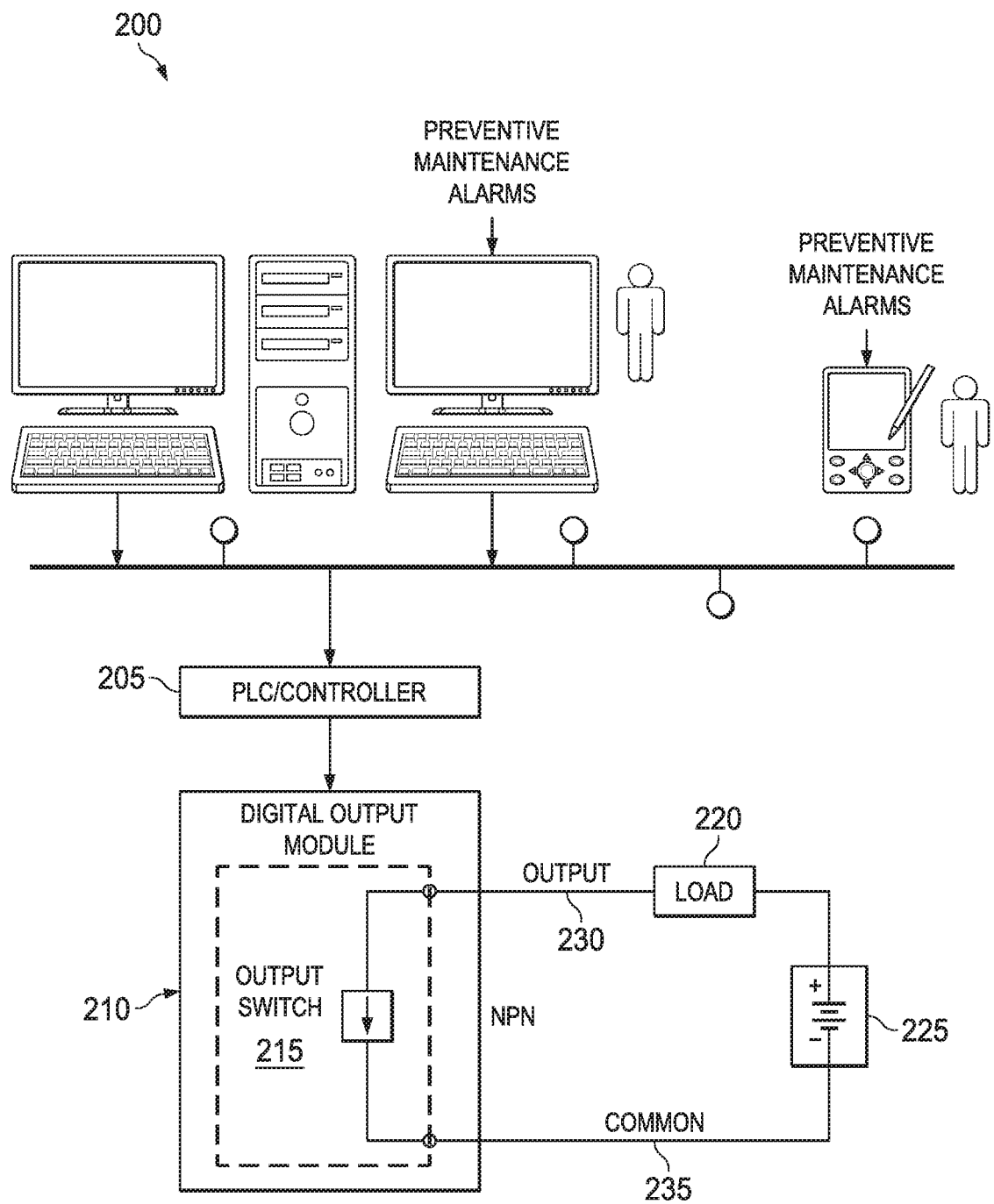
FIG. 2 illustrates an example digital output module for a device according to this disclosure.

FIG. 2 illustrates an example system 200 with a programmable logic controller (PLC) or other type of controller 205 and a digital output module 210 for a device according to this disclosure. The digital output module 210 contains an output switch circuit 215 for each channel to control a load 220. The digital output module 210 is also associated with readback and diagnostic circuitry to report output drive failures and field cable failures. The output switch circuit 215 includes an output 230 connected to the load 220, and a common port 235 connected to a battery 225. The architecture depicted in FIG. 2 can perform basic diagnostics, such as field cable open detection, short-circuit detection, and readback failure detection. However, the ability to measure the output current from the digital output module 210 allows various output device diagnostics that are more advanced to occur. These diagnostics could include, for example, the ability to monitor the health of actuators, solenoids, relays, motor starters, and lamps.

Figure 3:
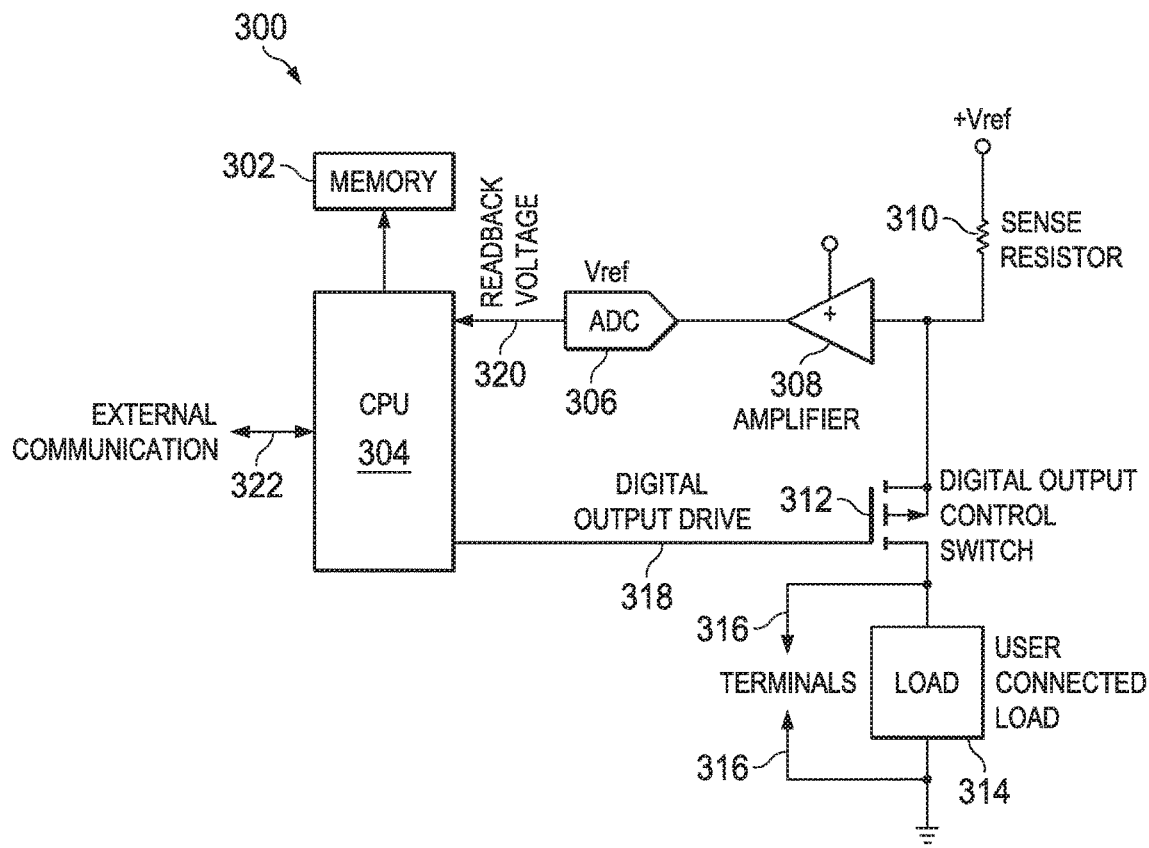
FIG. 3 illustrates a specific example of a universal input/output (UIO) module supporting device diagnostics according to this disclosure.

FIG. 3 illustrates a specific example of a UIO module 300 supporting device diagnostics according to this disclosure. The implementation of the UIO module 300 shown in FIG. 3 represents one specific example of a module containing a digital output that can be used for device diagnostics. However, this disclosure is not limited to use with this specific UIO module 300, and other UIO or I/O modules could be used.

The UIO module 300 includes analog-to-digital converter (ADC) 306, an amplifier 308, a digital sense resistor 310, a digital output switch 312, a user connected load 314, and a pair of terminals 316. The terminals 316 are connected to a device for monitoring a digital output value.

The UIO module 300 here has the ability to read back a digital output current through the ADC 306. This type of readback is not performed in conventional designs for digital outputs since it would increase the cost and complexity of the module. The digital current is read back as a voltage across the digital sense resistor 310 shown in FIG. 3.

The UIO module 300 can include or be connected to a CPU 304 and a memory 302. The CPU 304 can transmit a signal 318 to the digital output device. The CPU 304 also can receive a readback voltage 320 from the UIO module 300 to perform diagnostics on the signal. The CPU 304 can perform external communication 322 with different external device or alarms. A controller or a PLC sends commands to the UIO module 300 to turn ON/OFF multiple digital output channels, which are received by the CPU 304. The CPU 304 commands the digital output switch 312 to turn the channels on or off. The UIO module 300 performs these actions continuously keeping the states of the digital output channels at the latest values. In addition, the CPU 304 continuously reads the conversions performed on the ADC 306 and stores these conversion results in the memory 302. The amplifier 308 amplifies the signal from the digital output control switch 312 to the ADC 306.

The readback value of the digital current is obtained by sensing the digital current using the low value digital sense resistor 310 in the current path. This low value resistance generates a voltage that is fed to the ADC 306 and sampled by the CPU 304, which is connected to the ADC 306. The ADC 306 is sampled at a rate used to characterize all the diagnostics that are targeted for a specific load.

The measured digital current can represent a valuable indicator of the health of an industrial process control and automation field device or other device. A number of diagnostics can be built around the health of discrete output devices.

Figure 4:
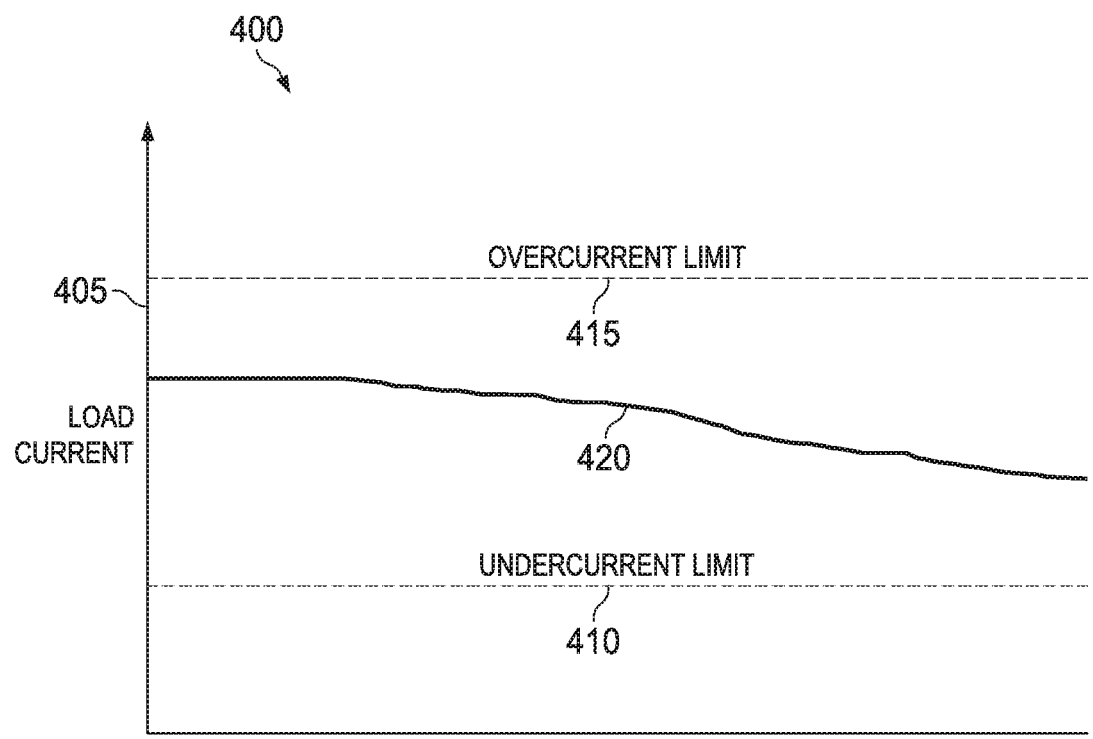
FIGS. 4 and 5 illustrate example types of diagnostics that can be performed for a device using a digital output according to this disclosure.
Figure 5:
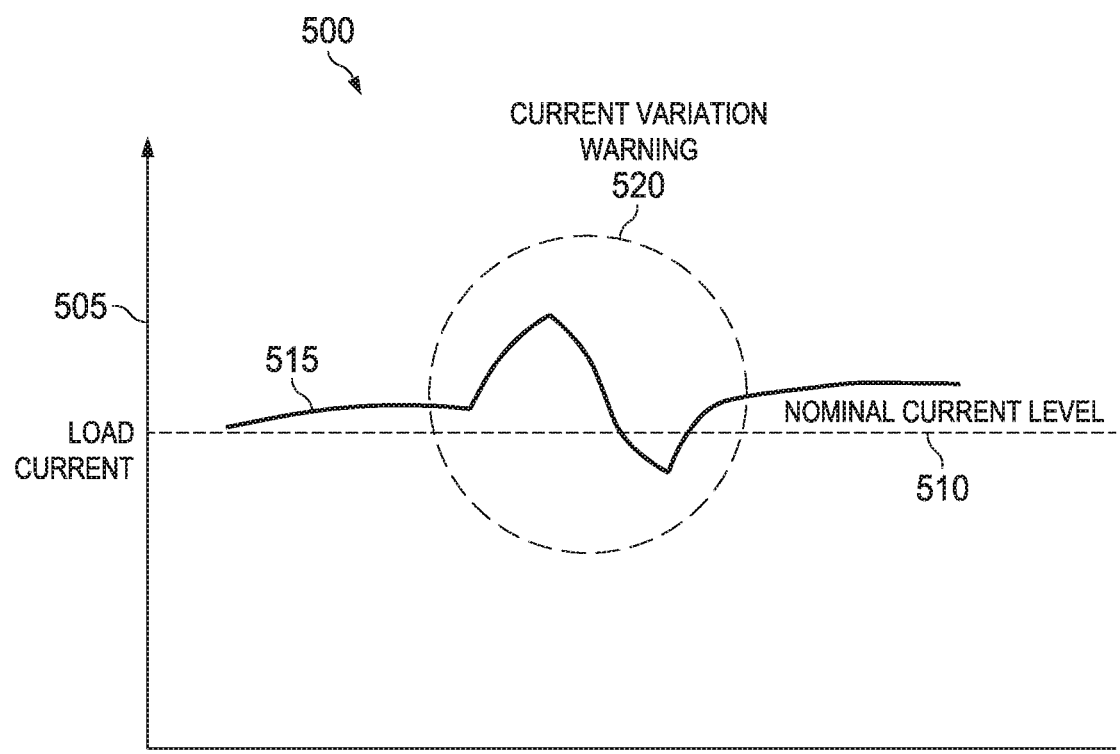

FIGS. 4 and 5 illustrate example types of diagnostics 400 and 500 that can be performed for a device using a digital output according to this disclosure. FIG. 4 illustrates an example output over-current or under-current diagnostic 400. The diagnostic 400 monitors the load current 405 of the digital output. This diagnostic can generate a warning or other notification if the actual output load current 420 of a digital output module violates an undercurrent limit 410 or overcurrent limit 415. This diagnostic 400 can also identify whether the output current drifts over a period of time. FIG. 5 illustrates an example output current variation diagnostic 500. The diagnostic 500 also monitors the load current 505 with a different focus. This diagnostic 500 can warn of unusual changes 520 in an output current draw 515, which could be an early warning of an output device short-circuit or open-circuit condition. For example, the unusual changes can occur when the output current draw 515 is trending away from a nominal current level 510.

In addition to these types of diagnostics, other or additional types of diagnostics could be designed around specific output devices by monitoring digital output current parameters (such as DC value, rate of change, amount of on-time, or amount of off-time). Some examples of device-specific diagnostics could include actuator diagnostics, solenoid diagnostics, relay diagnostics, motor starter current diagnostics, and lamp health diagnostics.

Figure 6:
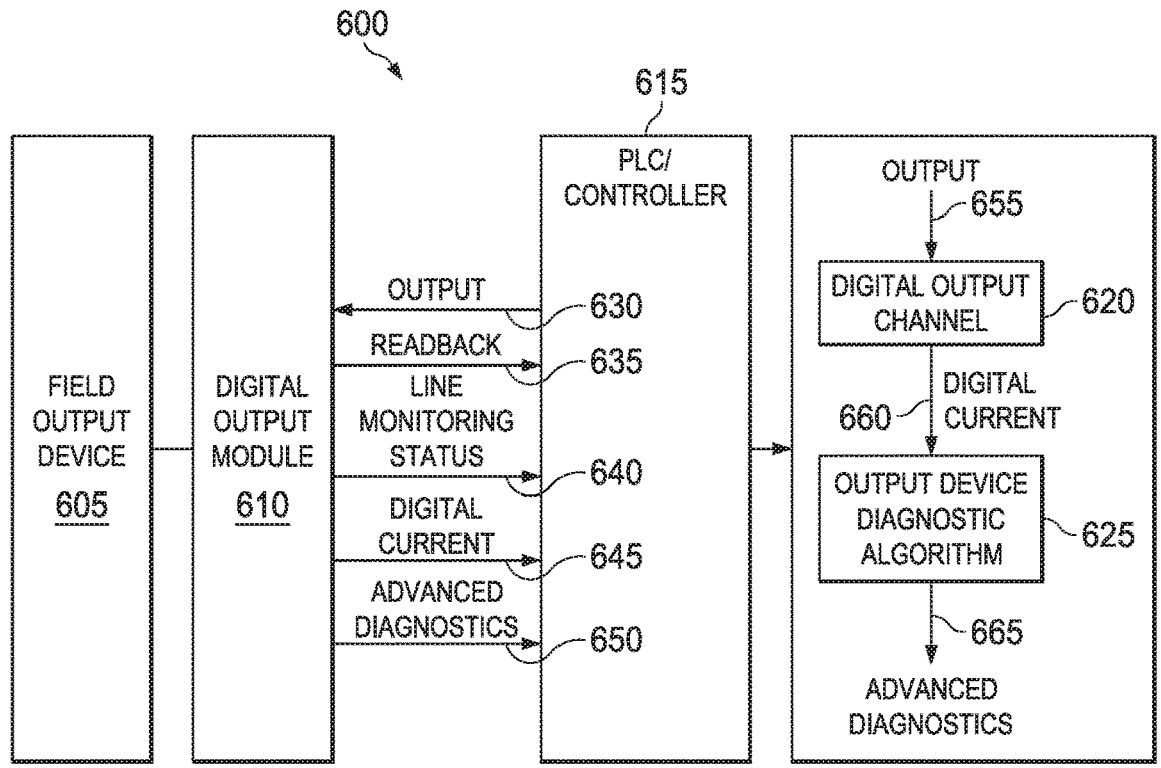
FIG. 6 illustrates an example system for device diagnostics using a digital output according to this disclosure.

FIG. 6 illustrates an example system 600 for device diagnostics using a digital output according to this disclosure. In this example, a user can be provided with the feedback digital current values. This could allow, for example, the user to develop custom diagnostics for specific field output devices 605. The illustrative system 600 includes a field output device 605, a digital output module 610, a controller 615, a digital output channel 620, and an output device diagnostic algorithm 625.

The digital output module 610 connects to the field output device 605 to monitor the digital outputs. The digital output module 610 receives output 630 from the controller 615. The digital output module 610 analyses the data and can provide readback 635, live monitoring status 640, digital current 645, and advanced diagnostics 650 to the controller 615. The digital output channel 620 receives an output 655 and provides a digital current 660 to the output device diagnostic algorithm 625. The output device diagnostic algorithm 625 outputs advanced diagnostics 665.

Additional details regarding specific implementations of a UIO module that could be used in this disclosure are provided in U.S. Pat. No. 8,656,065. Other example implementations of a UIO module that could be used in this disclosure are provided in U.S. Pat. No. 8,072,098. UIO modules supporting UNIVERSAL CHANNEL TECHNOLOGY from HONEYWELL INTERNATIONAL INC. are also suitable for use with this disclosure.

Although FIGS. 2 through 6 illustrate examples of digital output modules, UIO modules, diagnostics, and systems, these figures are for illustration only. For example, any suitable digital output modules or UIO or reconfigurable modules could be used to provide advanced device diagnostics. Also, the specific diagnostics performed could vary widely, such as based on the type of device coupled to a digital output module or UIO module. In addition, any suitable process could be performed using diagnostics associated with a digital output module or UIO module.

Figure 7:
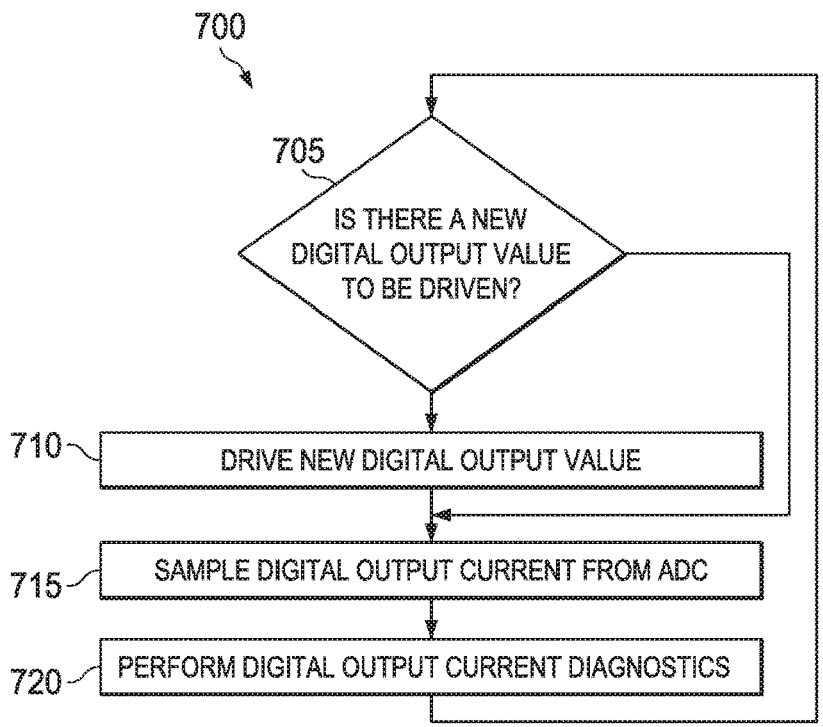
FIG. 7 illustrates a process for performing device diagnostics from signals on digital outputs according to this disclosure.

FIG. 7 illustrates a process 700 for performing device diagnostics from signals on digital outputs according to this disclosure. For example the process 700 depicted in FIG. 7 may be performed by the UIO module 300.

In step 705, the UIO module 300 determines whether anew digital output value is to be driven. In step 710, when the determination that a new digital output value is required, the UIO module 300 drives a new digital output value. In step 715, the UIO module 300 sample a digital output current from the ADC. In step 720, the UIO module 300 performs diagnostics on the digital output current. Example of digital output current diagnostics are provided in FIG. 8-10. The continuous time series of the readback current enables performance of diagnostics exemplified by FIGS. 8-10.

Figure 8:
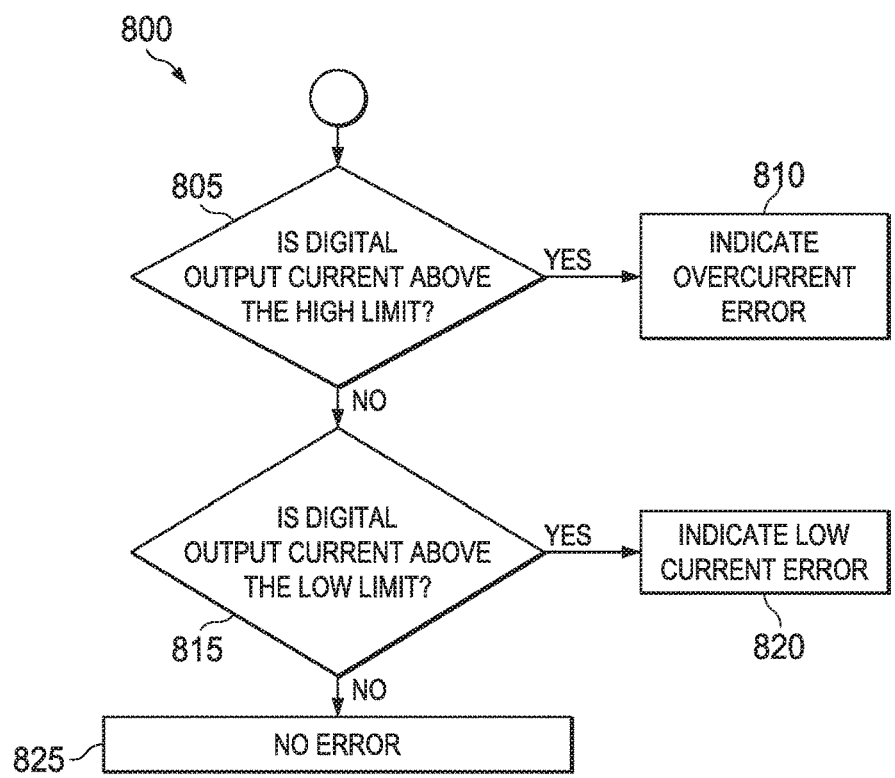
FIGS. 8, 9 and 10 illustrate example processes for performing digital output current diagnostics according to this disclosure.
Figure 9:
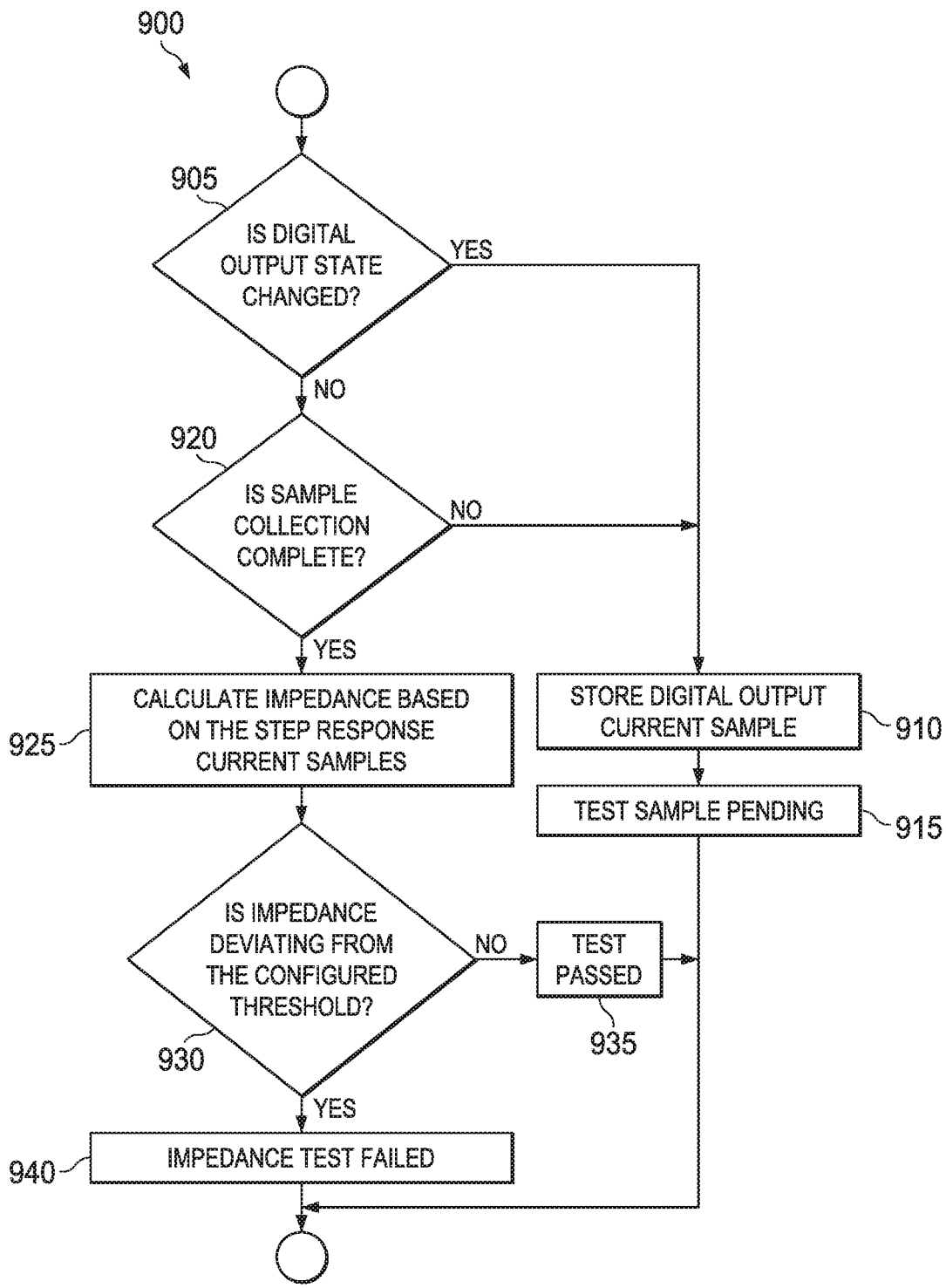
Figure 10:
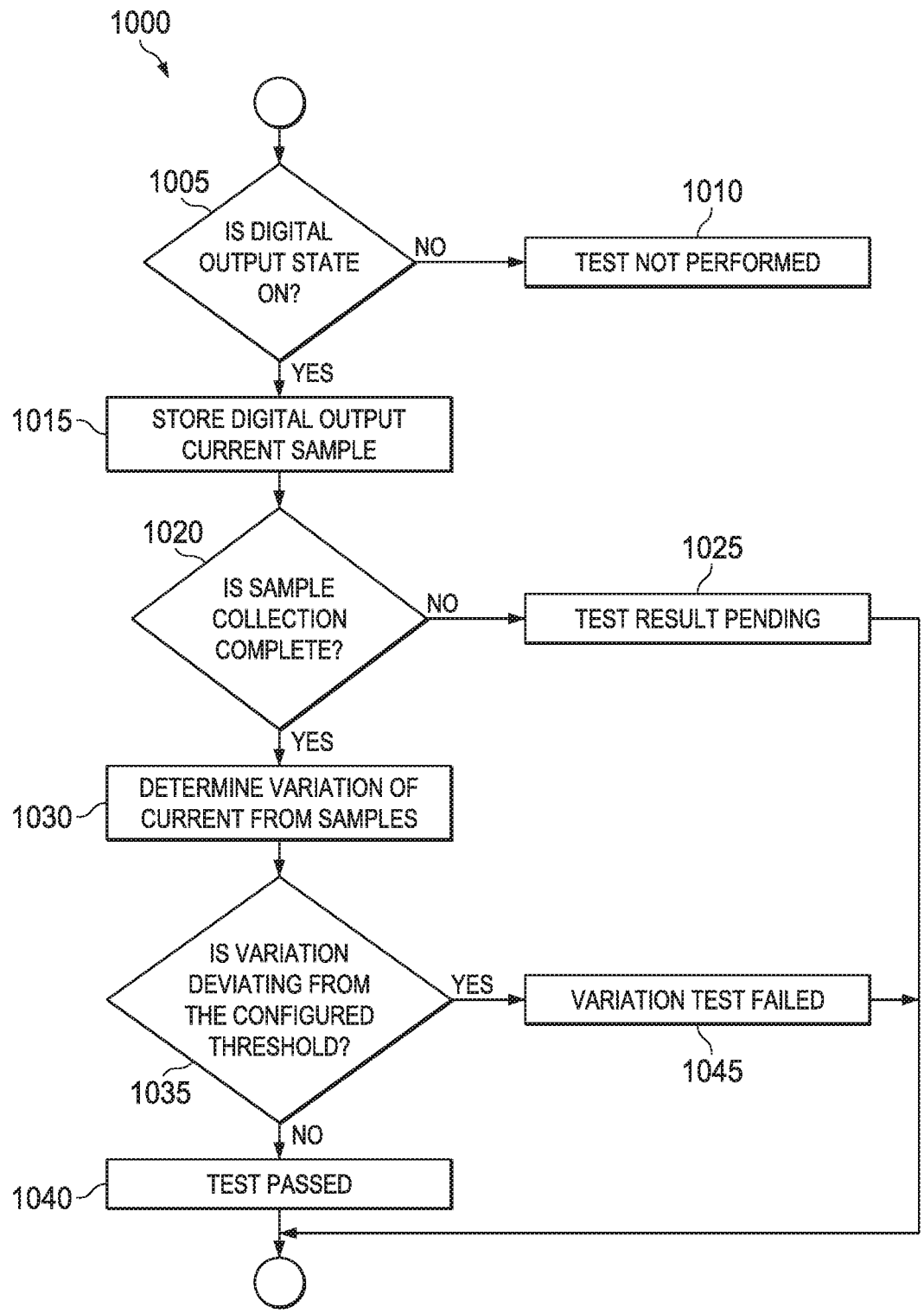

FIGS. 8, 9 and 10 illustrate example processes for performing digital output current diagnostics according to this disclosure. For example, the processes depicted in FIGS. 8-10 may be performed by the UIO module 300.

FIG. 8 illustrates an example process 800 for digital current crossing an upper or lower threshold indicating a degrading load, which is illustrated in FIG. 5. In step 805, the UIO module 300 determines whether the digital output current is above a high limit or upper threshold value. In step 815, when the digital output current is not above the high limit, the UIO module 300 determines whether the digital output current is below a low limit or a lower threshold value. The UIO module 300 indicates an overcurrent error in step 810 when the digital output current is above the high limit and indicates an low current error in step 820 when the digital output current is below the low limit. If neither limit is crossed and no error is indicated, the UIO module 300 indicates that the digital output has no error in step 825.

FIG. 9 illustrates an example process 900 for analysis of a step response to determine the impedance of the load. This test enables a determination whether the impedance of the load is changing over time and a threshold limit for failure has been reached. In step 905, the UIO module 300 determines whether a digital output state is changed. If the digital output state has not changed, the UIO module 300 determines whether a sample collection is complete in step 920. When the digital output state has changed or the sample collection is not complete, the UIO module 300 stores the digital output current sample in step 910 and determines that test results are still pending in step 915. When the sample collection is complete, the UIO module 300 calculates an impedance based on the step response current sample in step 925. In step 930, the UIO module 300 determines whether the impedance is deviating from the configured threshold. When the impedance is not deviating from the configured threshold, the UIO module 300 determines that the test has been passed in step 935. When the impedance is deviating from the configured threshold, the UIO module 300 determines that the impedance test has failed in step 940.

FIG. 10 illustrates an example process 1000 for checking whether there are excessively noisy conditions near the load or if the load is experiencing degradation and causing varying current to be drawn. In step 1005, the UIO module 300 determines whether the digital output state is "ON." If the digital output state is not "ON," the test in not performed in step 1010. When the digital output state is "ON," the UIO module 300 stores the digital output current sample in step 1015. In step 1020, the UIO module 300 determines whether the sample collection is complete. If the sample collection is not complete, the UIO module 300 indicates that the test results are still pending in step 1025. If the sample collection is complete, the UIO module 300 determines a variation of the current from the samples in step 1030. In step 1035, the UIO module 300 determines whether a detected variation deviates from the configured threshold. If the variation deviates from the threshold, the UIO module 300 indicates that the variation test failed in step 1045. If the variation does not deviate from the threshold, the UIO module 300 indicates that the variation test has passed in step 1040.

Although FIGS. 7-10 illustrate examples of processes for performing device diagnostics from signals on digital outputs, respectively, various changes could be made to FIG. 7-10. For example, while shown as a series of steps, various steps in each figure could overlap, occur in parallel, occur in a different order, or occur multiple times. In the figures, "DO" stands for "digital output," "IO" stands for "input/output," "PLC" stands for "programmable logic controller," "ADC" stands for "analog-to-digital converter," and "$V_{ref}$" stands for a "reference voltage used for analog-to-digital conversions." A step response is the output response of a system when a step input is applied at the input of the system. The impedance is the combined effect of the resistance and reactance of a load. Sample refers to reading the instantaneous value of a physical parameter.

In some embodiments, various functions described in this patent document are implemented or supported by a computer program that is formed from computer readable program code and that is embodied in a computer readable medium. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable storage device.

It may be advantageous to set forth definitions of certain words and phrases used throughout this patent document. The terms "application" and "program" refer to one or more computer programs, software components, sets of instructions, procedures, functions, objects, classes, instances, related data, or a portion thereof adapted for implementation in a suitable computer code (including source code, object code, or executable code). The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," "system," "processor," or "controller" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method comprising:
   using an input/output module, measuring one or more characteristics of a digital signal provided by a digital output module of the input/output module, the digital output module coupled to a device, at least one of the one or more characteristics of the digital signal associated with a digital output current of the digital output module; and
   using the one or more measured characteristics of the digital signal including a readback value of the digital signal to perform one or more diagnostics, including:
      determining change in the digital output current;
      calculating an impedance based on a step response from the digital output current; and
         determining whether the impedance deviates from a configured threshold;
      wherein measuring one or more characteristics includes measuring the readback value of the digital signal using a digital sense resistor.

2. The method of claim 1, wherein the input/output module comprises a reconfigurable input/output module, the reconfigurable input/output module being reconfigurable as different types of inputs and outputs, the different types of inputs and outputs including a digital output type.

3. The method of claim 1, wherein measuring the one or more characteristics of the digital signal comprises obtaining the readback value of the digital output current through an analog-to-digital converter.

4. The method of claim 3, wherein obtaining the readback value comprises obtaining a voltage measurement across the digital sense resistor.

5. The method of claim 1, wherein performing the one or more diagnostics includes:
   determining whether the digital output current is above a high limit or below a low limit;
   indicating an overcurrent error when the digital output current is above the high limit;
   indicating a low current error when the digital output current is below the low limit; and
   indicating no error when the digital output current is below the high limit and above the low limit.

6. The method of claim 1, wherein performing the one or more diagnostics further includes
   indicating that an impedance test failed if the impedance deviates from the configured threshold.

7. The method of claim 1, wherein performing the one or more diagnostics includes:
   determining a variation of the digital output current from samples taken;
   determining whether the variation deviates from the configured threshold; and
   indicating that a variation test failed if the variation deviates from the configured threshold.

8. An apparatus comprising:
   an input/output module comprising a digital output module configured to be coupled to a device, the input/output module configured to:
      measure one or more characteristics of a digital signal provided by the digital output module, wherein at least one of the one or more characteristics of the digital signal is associated with a digital output current of the digital output module; and
      using the one or more measured characteristics of the digital signal, including a readback value of the digital signal the input/output module performs one or more diagnostics to:
         calculate an impedance based on a step response from the digital output current; and
         determine whether the impedance deviates from a configured threshold;
         wherein measuring one or more characteristics includes measuring the readback value of the digital signal using a digital sense resistor.

9. The apparatus of claim 8, wherein the input/output module comprises a reconfigurable input/output module, the reconfigurable input/output module being reconfigurable as different types of inputs and outputs, the different types of inputs and outputs including a digital output type.

10. The apparatus of claim 8, wherein, to measure the one or more characteristics of the digital signal, the input/output module is configured to obtain the readback value of the digital output current through an analog-to-digital converter.

11. The apparatus of claim 10, wherein, to obtain the readback value, the input/output module is configured to obtain a voltage measurement across the digital sense resistor.

12. The apparatus of claim 8, wherein, to perform the one or more diagnostics, the input/output module is configured to:
   determine whether the digital output current is above a high limit or below a low limit;
   indicate an overcurrent error when the digital output current is above the high limit;
   indicate a low current error when the digital output current is below the low limit; and
   indicate no error when the digital output current is below the high limit and above the low limit.

13. The apparatus of claim 8, wherein, to perform the one or more diagnostics, the input/output module is further configured to
   indicate that an impedance test failed if the impedance deviates from the configured threshold.

14. The apparatus of claim 8, wherein, to perform the one or more diagnostics, the input/output module is configured to:
   determine a variation of the digital output current from samples taken;
   determine whether the variation deviates from the configured threshold; and
   indicate that a variation test failed if the variation deviates from the configured threshold.

15. A non-transitory machine-readable medium encoded with instructions that, when executed, cause an input/output module to:
   measure one or more characteristics of a digital signal provided by a digital output module of the input/output module, wherein at least one of the one or more characteristics of the digital signal is associated with a digital output current of the digital output module; and
   use the one or more measured characteristics of the digital signal including a readback value of the digital signal to perform one or more diagnostics to:
      calculate an impedance based on a step response from digital output current; and
      determine whether the impedance is deviating from a configured threshold;

wherein measuring one or more characteristics includes measuring the readback value of the digital signal using a digital sense resistor.

16. The non-transitory machine-readable medium of claim 15, wherein the instructions that when executed cause the input/output module to measure the one or more characteristics of the digital signal comprise:
instructions that when executed cause the input/output module to obtain the readback value of the digital output current through an analog-to-digital converter.

17. The non-transitory machine-readable medium of claim 16, wherein the instructions that when executed cause the input/output module to obtain the readback value comprise:
instructions that when executed cause the input/output module to obtain a voltage measurement across the digital sense resistor.

18. The non-transitory machine-readable medium of claim 15, wherein the instructions that when executed cause the input/output module to perform the one or more diagnostics comprise:
instructions that when executed cause the input/output module to:
determine whether the digital output current is above a high limit or below a low limit;
indicate an overcurrent error when the digital output current is above the high limit;
indicate a low current error when the digital output current is below the low limit; and
indicate no error when the digital output current is below the high limit and above the low limit.

19. The non-transitory machine-readable medium of claim 15, wherein the instructions that when executed cause the input/output module to perform the one or more diagnostics comprise:
instructions that when executed cause the input/output module to:
indicate an impedance test failed if the impedance deviates from the configured threshold.

20. The non-transitory machine-readable medium of claim 15, wherein the instructions that when executed cause the input/output module to perform the one or more diagnostics comprise:
instructions that when executed cause the input/output module to:
determine a variation of the digital output current from samples taken;
determine whether the variation deviates from the configured threshold; and
indicate a variation test failed if the variation deviates from the configured threshold.

* * * * *